US006911641B2

(12) United States Patent
Tsai

(10) Patent No.: US 6,911,641 B2
(45) Date of Patent: *Jun. 28, 2005

(54) PSEUDORANDOM ASSIGNMENT BETWEEN ELEMENTS OF THE IMAGE PROCESSOR AND THE A/D CONVERTER CELLS

(75) Inventor: Richard H. Tsai, Arcadia, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/878,993

(22) Filed: Jun. 30, 2004

(65) Prior Publication Data

US 2004/0251397 A1 Dec. 16, 2004

Related U.S. Application Data

(63) Continuation of application No. 10/199,955, filed on Jul. 19, 2002, now Pat. No. 6,787,752
(60) Provisional application No. 60/306,753, filed on Jul. 19, 2001.

(51) Int. Cl.$^7$ .............................................. H01L 27/00
(52) U.S. Cl. ..................................... 250/208.1; 348/303
(58) Field of Search ...................... 250/208.1, 214 SW; 348/302–303, 307–308, 310

(56) References Cited

U.S. PATENT DOCUMENTS

| 6,155,488 A | 12/2000 | Olmstead et al. |
| 6,433,822 B1 | 8/2002 | Clark et al. |
| 6,476,864 B1 | 11/2002 | Borg et al. |
| 6,512,858 B2 | 1/2003 | Lyon et al. |
| 6,646,583 B1 | 11/2003 | Fossum et al. |
| 6,787,752 B2 * | 9/2004 | Tsai ........................ 250/208.1 |

* cited by examiner

Primary Examiner—Stephone B. Allen
Assistant Examiner—Patrick J. Lee
(74) Attorney, Agent, or Firm—Dickstein Shapiro Morin & Oshinsky LLP

(57) ABSTRACT

An image sensor with a plurality of elements which received images and a plurality of A/D conversion elements. A connection between the A/D converter and the image elements is substantially randomly assigned to avoid fixed pattern noise.

24 Claims, 1 Drawing Sheet

PSEUDORANDOM ASSIGNMENT BETWEEN ELEMENTS OF THE IMAGE PROCESSOR AND THE A/D CONVERTER CELLS

CROSS-REFERENCE TO RELATED APPLICATIONS

The present application is a continuation of U.S. application Ser. No. 10/199,955, filed on Jul. 19, 2002, now U.S. Pat. No. 6,787,752, the disclosure of which is herewith incorporated by reference in its entirety.

This application claims benefit of U.S. Provisional Application No. 60/306,753, filed Jul. 19, 2001.

BACKGROUND

An image acquisition system typically includes an array of photosensitive pixels which are successively switched in a circuit to connect to A/D converter cells. The photosensitive pixels receive incoming light, and produce an analog output indicative of the information in each pixel in the array. That analog information is then coupled to an analog to digital converter which converts the analog information into a digital value indicative thereof. Typically the elements of the array are connected to different analog to digital converter elements. The pixels are successively converted into digital values.

One way of carrying out this analog to digital conversion is via successive approximation A/D converter cells. However, the variation between such successive approximation cells causes an inherent variation in the output signals. This can cause fixed pattern noise, that is, a noise pattern which is superimposed over the actual image being obtained.

SUMMARY

The present invention describes a technique which may minimize the fixed pattern noise in a system which uses multiple A/D converters along with an array of image acquisition elements.

An aspect of this system may randomly assign relations between the image acquisition elements and the A/D converters.

BRIEF DESCRIPTION OF THE DRAWINGS

These and other aspects will now be described in detail with reference to the accompanying drawing, in which.

DETAILED DESCRIPTION

Figure 1:
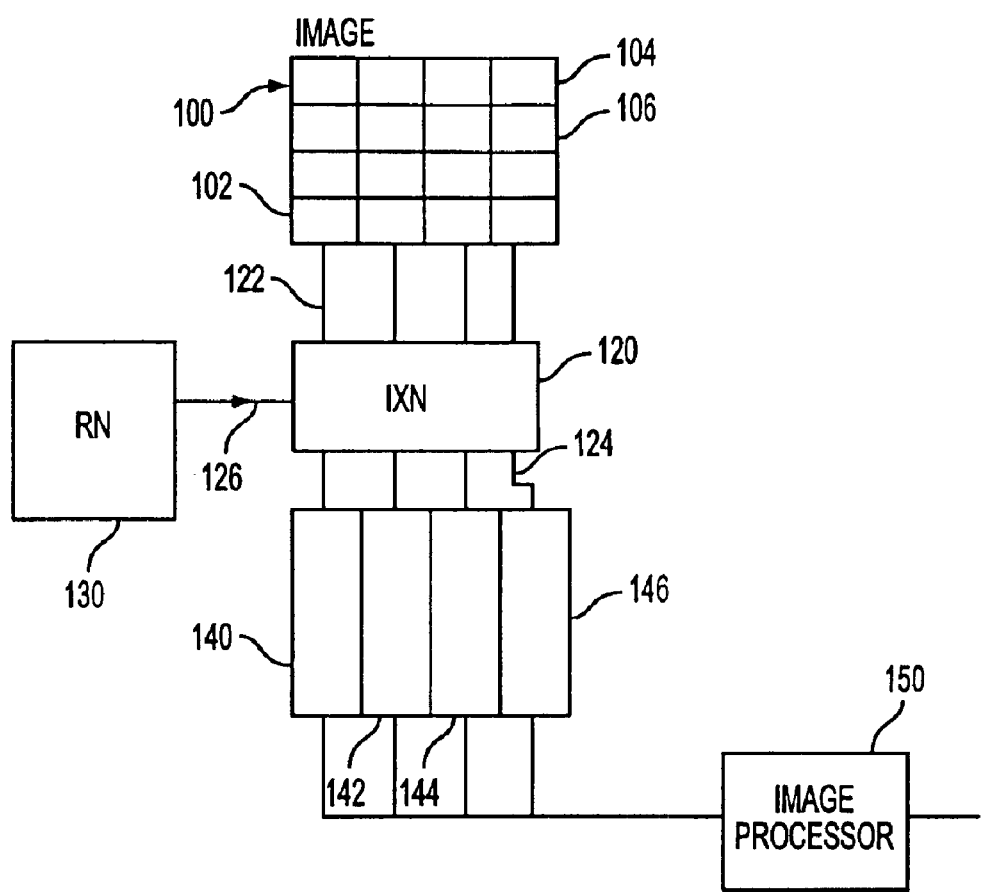
FIG. 1 shows a block diagram of a system which dynamically assigns between image sensing elements and A/D converters.

A typical system which uses multiple A/D converters operates as follows. The image sensor array is connected to switches which switch pixels of the image sensor array to analog to digital converters in a specified sequence. For example, there may be multiple analog to digital converters, especially when successive approximation type converters are used. Each of these converters may require multiple clock cycles to "settle" on a specified digital value. Therefore, multiple converters are often used to increase the throughput of the system as a whole. In a typical image sensor device, the pixels of the array are switched to the converters in sequence. For example, the first pixel in row 1 may be switched to the first of the successive approximation converters. The second pixel in row 1 may be switched to the second of the converters during the same time period. During a subsequent clock cycle, the second row is converted in a similar way; with the first pixel in the row switched to the first converter and the second pixel in the row switched to the second converter.

The inventor noticed, however, that this requires that each successive approximation cell is always used for the same conversion within a frame. Any variation between these cells forms a fixed pattern of noise. This noise can be seen by a user.

According to the present invention, a circuit is described which provides a pseudo random assignment between successive approximation cells and sensors in the image. In the embodiment, there are N of the A/D converter cells, which in the embodiment can be successive approximation A/D converters. Four cells, 140, 142, 144, 146 are shown. In a particularly-preferred embodiment, there may be the same number of cells as there are elements in a particular row of the image sensor. The image sensor 100 is shown with a first row 104 and a second row 106, each having also four elements. In an exemplary system, each column is switched, such that its pixels go to a specified A/D converter. In this embodiment, each of the pixels 102 is connected to 1×N switching circuit 120. The 1×N switching circuit 120 has the capability of switching any of its inputs 122 to any of its outputs 124. The switching arrangement of the 1×N switching circuit 120 is controlled by a random number generator 130, which produces a random number output 126.

By random, applicants intend to cover all forms of numbers which are effectively random, such as pseudorandom, and other such sequences that continually change. That is, the random number generator 130 will output a constantly varying stream of digits, which may be pseudorandom, but which will be continually varying. The effect is that each time an image sensor element is read out, it is randomly, or effectively randomly assigned to one of the successive approximation cells.

The output values are connected to an image processor 150 which image processes the output in the conventional way. For example, this may use correlated double sampling and the like.

The effect of this system is that even though there will still be the same amount of variation between successive approximation cells, there will not be fixed pattern noise. The noise is still at the same level. However, the noise is spread randomly among the cells, and hence the human eyes will be much less sensitive to that noise. The random noise, in a perfect situation, would effectively average out. Therefore, the effect of the noise will be much less pronounced than the effect of the noise in other such systems.

The combinations may randomly map between the pixels and the n successive approximation cells. For example, if there are four of the successive approximation cells, the possible combinations may be (1, 3, 0, 2); (3, 0, 2, 1); (0, 1, 3, 2) and the like. There are several different techniques available to make these kinds of combinations.

It is also possible to have M (=N/n) combinations in order to simplify the generator, in which case the generator may extend between 0 and M−1+k*M.

Any other technique of forming a pseudorandom association may also be used as long as the device effectively continuously varies the relationship between the pixels and the A/D converter cells which convert the pixels.

Although only a few embodiments have been disclosed in detail above, other modifications are possible. For example, other kinds of A/D converters may be used in the same way, and this technique is applicable so long as there is more than one A/D converter. Other techniques beside pseudorandom number generators can be used to continuously vary the connection between the pixels and the A/D converter elements. In addition, this system can operate on a line-by-line basis, an element-by-element basis, or a frame-by-frame basis. For example, the connections between image sensor element and A/D converters need not be done more often than once per frame, if necessary. All such modifications are intended to be encompassed within the following claims:

What is claimed is:

1. An image processing system, said image processing system comprising:
   an image sensor, said image sensor comprising:
   an image acquisition array, having an array of image acquisition elements;
   a plurality of A/D converter elements, each of said A/D converter elements capable of converting a signal from a single element of said image sensor array into a digital value;
   a switch array, between said array of image acquisition elements and said A/D converter elements, said switch array substantially randomly varying an assignment between each of said image acquisition elements and each of said A/D converter elements; and
   an image processor, said image processor processing an image acquired by said image sensor.

2. The image processing system of claim 1, further comprising a random number generator, which produces a number which is effectively random, and outputs said number to said switch array.

3. The image processing system of claim 2, wherein said random number generator is a pseudorandom combination generator.

4. The image processing system of claim 2, wherein said A/D converter elements are successive approximation elements.

5. The image processing system of claim 2, wherein said image acquisition elements are CMOS image sensing elements.

6. The image processing system of claim 2, further comprising a correlated double sampling element, receiving an output of each of said A/D converter elements.

7. A method of processing an image, comprising:
   receiving image elements from pixels of an image sensor;
   substantially randomly assigning each element from each pixel to a specified A/D converter for conversion; and
   processing said image acquired by said image sensor.

8. The method of claim 7, wherein said substantially randomly assigning comprises assigning using a pseudorandom combination generator.

9. The method of claim 7, further comprising A/D converting said image signals from said pixels in the A/D converter which is assigned substantially randomly.

10. The method of claim 9, wherein said A/D converting comprises using the successive approximation technique to A/D convert said image signals.

11. The method of claim 7, wherein said substantially randomly assigning comprises using a switch to switch elements from said pixel to elements from said A/D converter.

12. The method of claim 11, wherein said substantially randomly assigning further comprises driving said switch using a pseudorandom combination generator.

13. A method of processing an image, comprising:
   obtaining image elements in pixels of an image sensor;
   substantially randomly assigning each element to an A/D converter;
   converting said image elements in a plurality of separate image A/D converters which have variations between the A/D converters but without adding fixed pattern noise via said converting; and
   processing said image acquired by said image sensor.

14. The method of claim 13, wherein said converting comprises substantially continually varying a connection between said pixels and said A/D converters.

15. The method of claim 13, wherein said converting comprises using a pseudorandom number generator to assign a relationship between said image elements and said A/D converters.

16. The method of claim 13, wherein said converting comprises successive approximation A/D converting.

17. The method of claim 13, wherein said obtaining image elements comprises using a CMOS image sensor to obtain said image elements.

18. An image system, comprising:
   an image acquisition array, having an array of image acquisition elements;
   a plurality of A/D converter elements;
   a random output element, which produces a random output, coupled to said image acquisition array and said plurality of A/D converter elements; and
   a processor which processes an image acquired by said array.

19. The image system of claim 18, wherein said random output element produces a random number.

20. The image system of claim 19, further comprising a switch between said image acquisition array and said A/D converter elements, and wherein said random number sets a connection of said switch.

21. The image system of claim 20, wherein said switch is a 1×N switch, where N is a number of A/D converter elements.

22. The image system of claim 21, wherein said number sets a connection between each of said inputs, and each of said A/D converter elements.

23. The image system of claim 21, wherein said A/D converter elements are successive approximation A/D converter elements.

24. The image system of claim 18, wherein said random output element is a random number generator that controls the connection between elements of said image acquisition array, and said A/D converter elements.

* * * * *